United States Patent [19]
Wang et al.

[11] Patent Number: 5,972,746
[45] Date of Patent: Oct. 26, 1999

[54] METHOD FOR MANUFACTURING SEMICONDUCTOR DEVICES USING DOUBLE-CHARGED IMPLANTATION

[75] Inventors: Chih-Hsien Wang; Min-Liang Chen, both of Hsinchu; San-Jung Chang, Chang-Hwa; Saysamone Pittikoun, Hsinchu, all of Taiwan

[73] Assignee: Mosel Vitelic, Inc., China

[21] Appl. No.: 08/727,076

[22] Filed: Oct. 8, 1996

[51] Int. Cl.⁶ .............................................. H01L 21/8238
[52] U.S. Cl. ..................... 438/223; 438/224; 438/227; 438/448
[58] Field of Search ..................... 438/439, 448, 438/404, 405, 410, 414, 217, 218, 219, 223, 224, 225, 227, 228, 232, 289, 294, 297, 307

[56] References Cited

U.S. PATENT DOCUMENTS

| | | | |
|---|---|---|---|
| 4,459,325 | 7/1984 | Nozawa et al. | 438/448 |
| 5,358,893 | 10/1994 | Yang et al. | 438/448 |
| 5,393,679 | 2/1995 | Yang | 438/217 |
| 5,397,733 | 3/1995 | Jang | 438/448 |
| 5,403,770 | 4/1995 | Jang | 438/439 |
| 5,422,301 | 6/1995 | Otsuki | 438/217 |
| 5,447,885 | 9/1995 | Cho et al. | 438/448 |
| 5,543,343 | 8/1996 | Bryant et al. | 438/448 |
| 5,599,731 | 2/1997 | Park | 438/448 |
| 5,677,234 | 10/1997 | Koo et al. | 438/439 |
| 5,691,233 | 11/1997 | Matsumoto | 438/439 |
| 5,789,269 | 8/1998 | Mehta et al. | 438/439 |
| 5,814,551 | 9/1998 | Park et al. | 438/448 |

Primary Examiner—Charles Bowers
Assistant Examiner—Jack Chen
Attorney, Agent, or Firm—Townsend and Townsend and Crew LLP

[57] ABSTRACT

The invention provides an isolation technique using fewer process steps and a double charged implantation step (141) for defining a well region (139) of a CMOS integrated circuit device. The invention provides steps of providing a semiconductor substrate comprising an multiple layer of films (105, 107, 109). These films include an oxide layer (105) overlying the substrate, a polysilicon layer (107) overlying the oxide layer, and a nitride layer (109) overlying the polysilicon layer. The invention also uses a step of removing a first portion of the nitride layer and a first portion of the polysilicon layer defined underlying the first portion of the nitride layer and removing a second portion of the nitride layer and a second portion of the polysilicon layer defined underlying the second portion of the nitride layer. This sequence of steps provides a partially completed semiconductor structure that defines isolation regions before forming well regions for active devices.

17 Claims, 7 Drawing Sheets

METHOD FOR MANUFACTURING SEMICONDUCTOR DEVICES USING DOUBLE-CHARGED IMPLANTATION

BACKGROUND OF THE INVENTION

The present invention relates to the fabrication of semiconductor integrated circuits. More particularly, the present invention provides a technique, including a method and structure, for forming an isolation region and using double-charged implantation of a semiconductor substrate in the manufacture of complementary metal oxide silicon (CMOS) devices. But it can be recognized that the technique has a wide range of applicability. For instance, the technique can be applied to the manufacture of BiCMOS and the like.

In the manufacture of semiconductor integrated circuits, devices must be isolated from each other and from specific electrical paths. As device geometry becomes smaller, however, it is more difficult to keep such devices isolated using conventional techniques. A variety of these techniques have been proposed to keep such devices isolated. These techniques were made depending upon the type of integrated circuit being processed. For instance, these integrated circuits can use technologies such as bipolar, NMOS (N-type channel metal oxide silicon), PMOS (P-type channel metal oxide silicon), CMOS, BiCMOS (bipolar complementary metal oxide silicon), and the like.

In NMOS devices, for instance, a conventional technique for isolating devices is known as the local oxidation of silicon, commonly termed LOCOS. LOCOS generally uses steps of providing a semiconductor substrate. A layer of high quality oxide is defined overlying the substrate. A silicon nitride layer is defined overlying the oxide layer. Photolithography techniques define the silicon nitride layer leaving exposed regions of the oxide layer. The entire structure is placed into a furnace for oxidation to increases the thickness of the exposed oxide regions, which define the isolation regions. But the oxide regions underlying the nitride layer are substantially unoxidized, which provide a relatively flat surface region for the formation of a well region. The nitride layer is removed and devices can be formed in the flat surface region located between the isolation regions. Semiconductor devices such as MOS devices and the like are defined on the relatively flat surface region.

As device geometries reached sub-micron levels, however, it became necessary to replace the conventional LOCOS technique which has severe limitations for isolating the devices. In particular, the conventional LOCOS technique often did not effectively isolate the semiconductor devices from each other due to the harsher operating requirements, e.g, higher electric field, faster switch speeds, etc. In addition, as these devices became smaller, the feature size of the isolation regions provided by LOCOS was generally too large for the effective miniaturization of the devices.

Accordingly, other techniques have been proposed to overcome these and other limitations of the conventional LOCOS technique. These techniques, however, were extremely complicated and often added numerous process steps, which tended to reduce device yields and increase device turn-around-time. Examples of these techniques included modified LOCOS, silicon on insulator (SOI), silicon on sapphire (SOS), and others. A detailed discussion of these techniques can be found in Silicon Processing VLSI Era, Volume 2—Process Integration by Stanley Wolf, Lattice Press.

From the above, it is seen that a technique for fabricating a semiconductor isolation structure that is easy, reliable, and cost effective, is often desired.

SUMMARY OF THE INVENTION

According to the present invention, a technique for fabricating an isolation structure for semiconductor integrated circuits is provided. This technique uses fewer processing steps than conventional techniques and relies upon double-charged implantation techniques for defining well regions for semiconductor devices such as MOS, CMOS, etc.

In a specific embodiment, the present invention provides a method for fabricating an isolation structure in an integrated circuit device using fewer processing steps. The method includes a step of providing a semiconductor substrate comprising an oxide layer overlying the substrate, a polysilicon layer overlying the oxide layer, and a nitride layer overlying the polysilicon layer. Steps of removing a first portion of the nitride layer and a first portion of the polysilicon layer defined underlying the first portion of the nitride layer, and removing a second portion of the nitride layer and a second portion of the polysilicon layer defined underlying the second portion of the nitride layer also are included. The oxide regions underlying the first and second portions of the nitride layer will define the field oxide isolation regions. Well regions will be defined adjacent to these field isolation oxide regions. These steps do not use the protection oxide layers of the conventional techniques thereby having fewer process steps.

An alternative method for fabricating an integrated circuit also is provided. This method includes a step of providing a semiconductor substrate comprising a first region and a second region therein. Steps of forming a first field isolation region defined between the first region and the second region, and forming a second field isolation region defined adjacent to the second region are also included. A first channel stop region is defined underlying the first field isolation region and a second channel stop region is defined underlying the second field isolation region. Further steps of defining a first well region by a first impurity type in the first region and defining a second well region by a second impurity type in the second region are also included. As shown, field oxide isolation regions are defined before well region formation to provide fewer masking steps, as compared to conventional techniques.

A further embodiment provides a partially completed semiconductor substrate which is defined for fewer process steps. The semiconductor substrate comprises a first region and a second region. The semiconductor substrate has an oxide layer overlying the first region and the second region. A polysilicon layer is defined overlying the oxide layer. This polysilicon layer has a first polysilicon layer portion overlying the first region and a second polysilicon portion overlying the second region. The substrate also includes a nitride layer overlying portions of the polysilicon layer, whereupon the nitride layer has openings overlying portions of the first region and the second region. The first polysilicon layer portion and the second polysilicon layer portion are thinner than another portion of the polysilicon layer. Impurities are implanted through these thinner regions to define channel stop regions in the substrate. This structure allows for the formation of isolation regions before well regions.

The present invention achieves these benefits in the context of known process technology. However, a further understanding of the nature and advantages of the present invention may be realized by reference to the latter portions of the specification and attached drawings.

DESCRIPTION OF THE SPECIFIC EMBODIMENT

Conventional Fabrication Techniques

Figure 1:
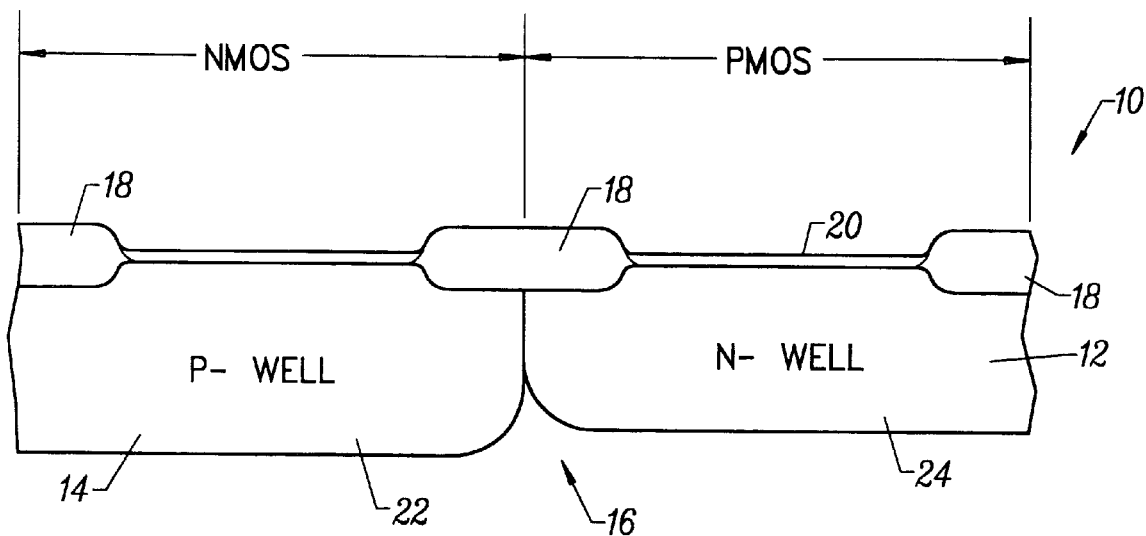
FIG. 1 is a semiconductor substrate using a conventional LOCOS isolation structure.

FIG. 1 is a simplified diagram of a conventional isolation structure 10 using a LOCOS process. The isolation structure 10 is for CMOS devices, which include NMOS (N-type channel) and PMOS (P-type channel) devices. The NMOS device is defined in the P-type well region 22. The PMOS device is defined in the N-type well region 24. Overlying the well regions is a gate oxide layer 20. Field isolation oxide regions 18 provide isolation between the P-type well region 14 and the N-type well region 24. This isolation structure is made using a conventional fabrication technique.

The conventional fabrication technique may be briefly outlined as follows.

(1) Provide a P-type impurity semiconductor substrate
(2) Form an oxide layer
(3) Mask 1: Define N-type well regions
(4) Etch N-type well regions
(5) Strip resist
(6) Form first protective oxide layer
(7) Remove first protective oxide layer
(8) Form second protective oxide layer
(9) Implant N-type impurities defining N-type well regions
(10) Remove second protective oxide layer
(11) Form third protective oxide layer
(12) Mask 2: Define P-type well regions
(13) Implant P-type impurities defining P-type well regions
(14) Strip resist
(15) Drive-in impurities
(16) Form pad oxide layer
(17) Form silicon nitride layer
(18) Mask 3: Define field isolation regions
(19) Etch field isolation regions
(20) Strip resist
(21) Mask 4: Define N-type impurity channel stop regions
(22) Implant N-type impurities defining N-type channel stop regions
(23) Strip resist
(24) Form field isolation regions via oxidation
(25) Remove silicon nitride layer
(26) Remove pad oxide layer
(27) Form sacrificial oxide layer
(28) Implant N-type impurities to adjust threshold voltage
(29) Remove sacrificial oxide
(30) Form gate oxide layer As can be seen, the conventional fabrication technique requires numerous processing steps. In addition, the conventional fabrication technique requires the use of a first, second, and third protective oxide layers, which further add to the complexity of the devices. The Figs. below briefly describe each of the above steps.

Figure 2:
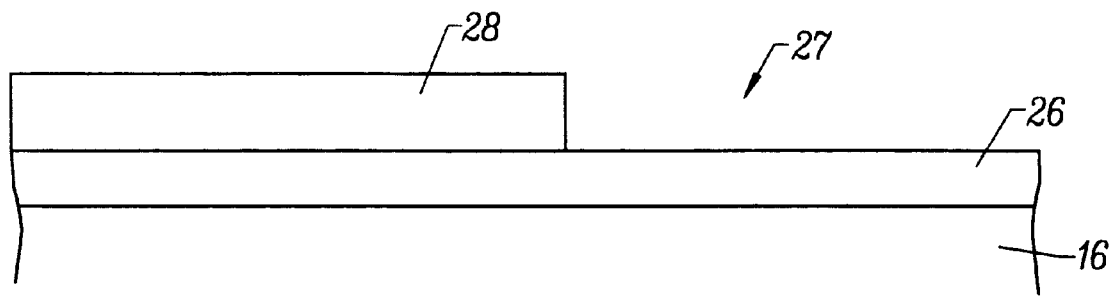
FIGS. 2–10 illustrate a technique for fabricating the conventional LOCOS isolation on structure of FIG. 1.

The Figs. illustrate a technique for fabricating the conventional isolation structure of FIG. 1. The conventional technique begins by providing a semiconductor substrate 16, which is doped using P-type impurities, as shown by FIG. 2. The substrate is oxidized to form an initial oxide layer 26. A portion of the initial oxide layer will be used as a masking layer in a subsequent implantation step. The initial oxide layer 26 is often formed by a conventional oxidation technique such as steam, wet dipping, and others. A photolithography step defines a photoresist layer 28, which exposes a portion of the initial oxide layer 27 for an N-type well region.

An etching step removes the initial oxide layer portion overlying the exposed region for the N-type well region. The remaining initial oxide layer portion defines a mask, which will be used in the implantation of the N-type impurities. The photoresist is then stripped.

Figure 3:
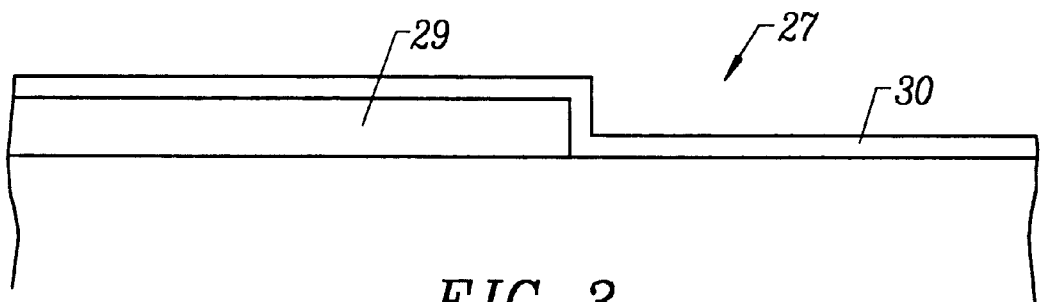

An oxidation step forms a first protection oxide layer 30 overlying the N-type well region 27 and the initial oxide layer 29, as shown by FIG. 3. The first oxidation step provides a protective oxide layer overlying the exposed N-type well region for substrate (or wafer) storage. The first protection oxide layer 30 is removed and a second protection oxide layer 33 is grown. The second protection oxide layer 33 forms overlying the initial oxide layer 29 portion and the N-type well region 27. This structure is now ready for implantation.

Figure 4:
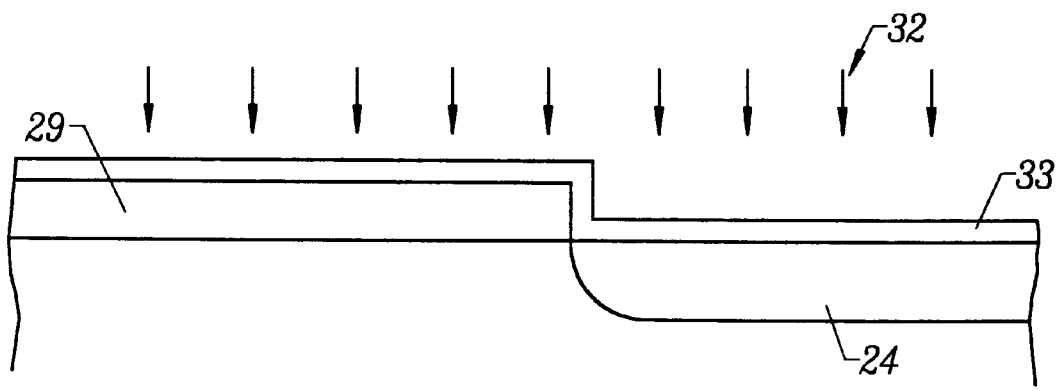

Ion implantation defines an N-type well region 24, as shown by FIG. 4. As shown, the initial oxide layer is used as a mask. The second protection oxide layer 32 acts as a screen for the implantation process. The implantation process often occurs using N-type impurities such as phosphorous and the like. After implantation, the N-type well region is defined in the substrate. The initial oxide layer and the second protection oxide layer are removed using wet etching techniques.

Figure 5:
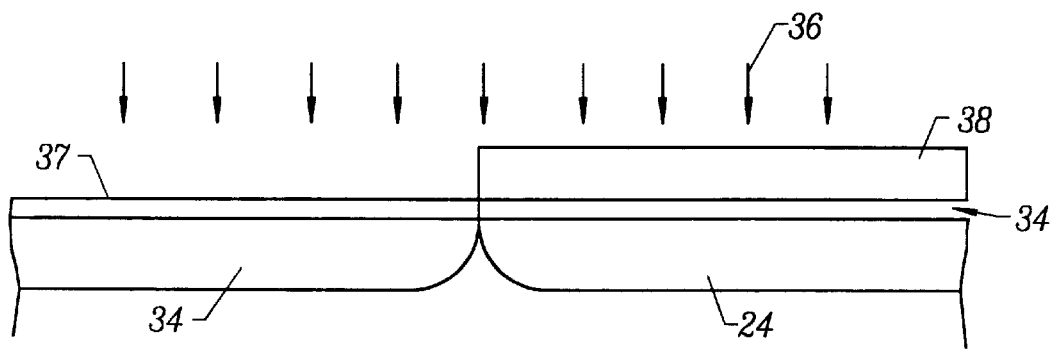

Another protection oxide layer 39 is defined overlying the substrate including an N-type well region 24 and an opening 37 for the P-type well region, as illustrated by FIG. 5. A photolithography step defines a photoresist layer 38 overlying the N-type well region to expose the P-type well region. A step of ion implantation introduces P-type impurities into the P-type well region 34. The photoresist is stripped.

Figure 6:
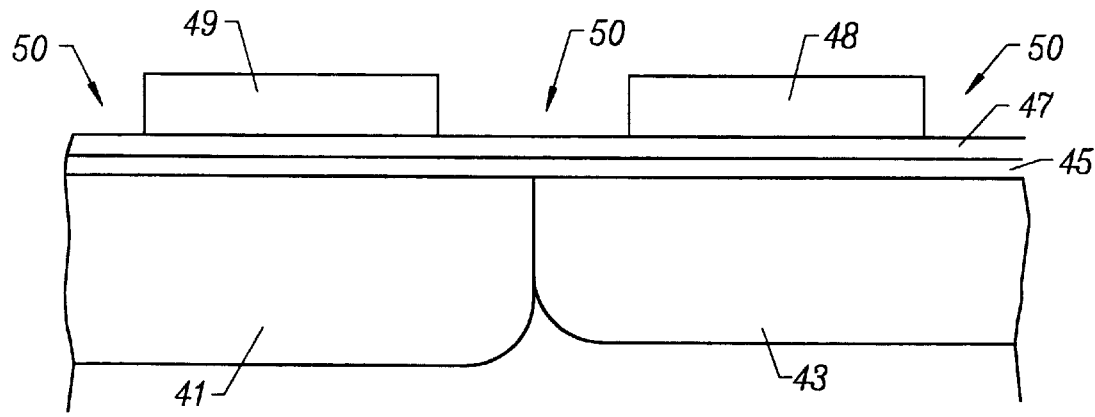
Figure 7:
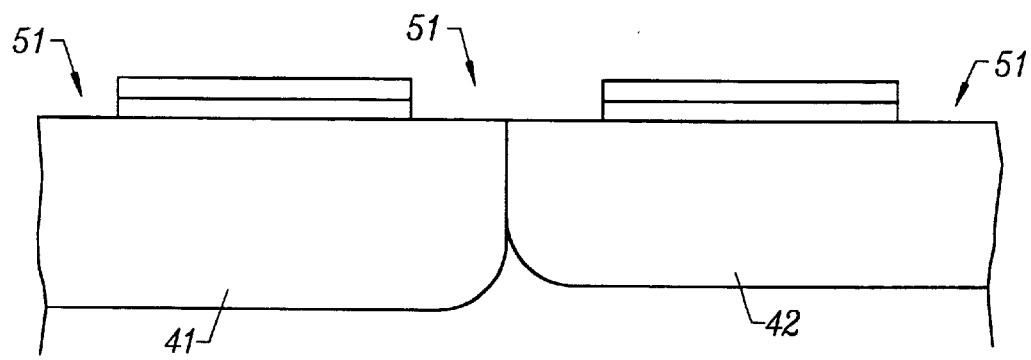

A well drive-in step drives impurities into the substrate to define the N-type well region 43 and the P-type well region 41, as shown by FIG. 6. A pad oxide layer 45 and a nitride layer 47 are defined overlying the well regions. A photolithography step defines openings 50 for the isolation regions. An etching step removes portions of the pad oxide layer 45 and the nitride layer 47 to define exposed regions 51 of the substrate, shown by FIG. 7. These exposed regions will define sites for the field isolation oxide regions.

Figure 8:
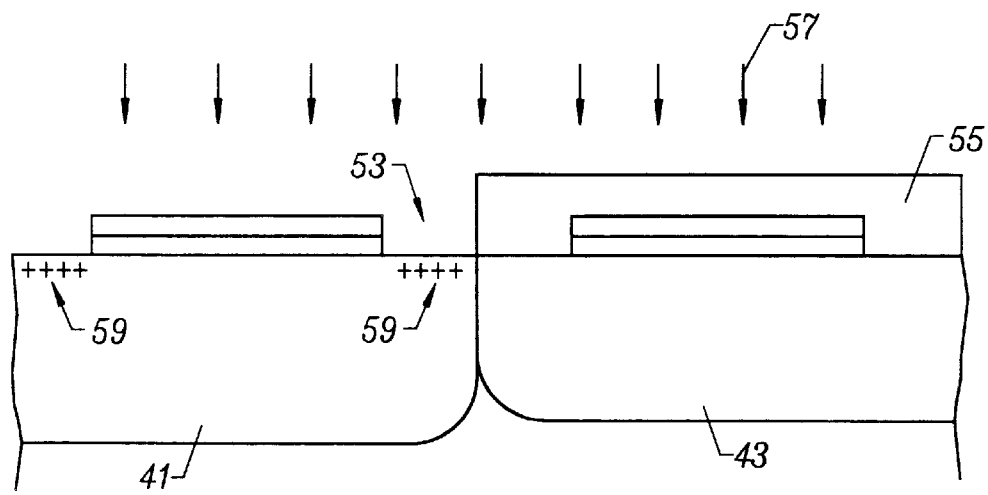

A photolithography step defines a photoresist 55 layer with opening(s) 53 in the P-type well region 41 for implantation, as shown by FIG. 8. P-type impurities 57 will be introduced through the opening to define channel stop regions 59. The channel stop regions tend to prevent the formation of parasitic devices, which are generally undesirable in the manufacture of the CMOS devices. The photoresist layer 55 is stripped.

Figure 9:
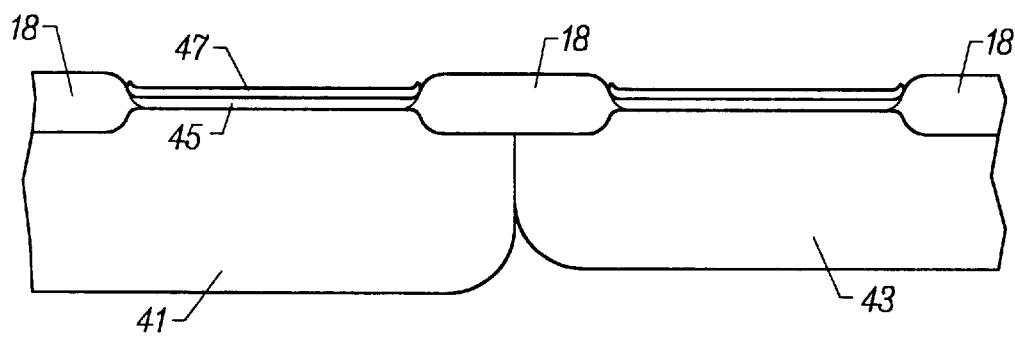

A field oxidation step defines field isolation oxide regions 18, as shown by FIG. 9. These field isolation oxide regions are formed using a technique known as the local oxidation of silicon (LOCOS). A detailed discussion of this technique is presented in Silicon Processing for VLSI Era, Volume 2—Process Integration by Stanley Wolf, Lattice Press. As can be seen, the pad oxide layer underlying the nitride layer does not oxidize as fast as the exposed regions to define the field isolation oxide regions 18. The nitride and oxide layer are removed.

Figure 10:
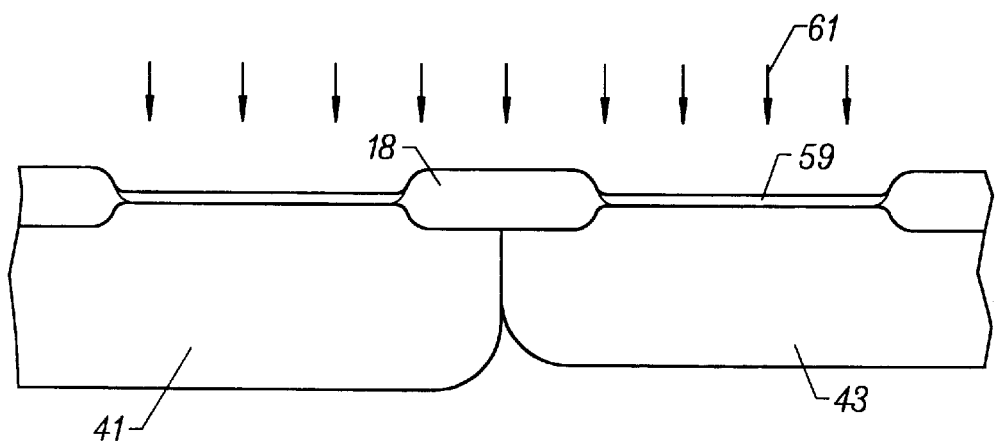

A sacrificial oxide layer 59 is defined overlying the P-type well region 41 and the N-type well region 43, as shown by FIG. 10. An implantation step sets the threshold voltage of the devices by introducing impurities in the channel regions of the NMOS and PMOS devices. The completed isolation structure is defined by FIG. 1 shown above.

As can be seen by the above sequence of fabrication steps, the conventional technique for defining isolation structures is extremely complicated. Numerous process steps using a variety of protection oxide steps are performed on the device. Each of these process steps tends to increase the amount of impurities introduced into the semiconductor integrated circuit. They also tend to increase the probability of miss-operations and the like, thereby leading to lower device yields and greater devices costs. These process steps further increase the amount of machine utilization thereby adding to the fabrication costs of the integrated circuit. Accordingly, it is generally undesirable to have a semiconductor process with such numerous process steps.

Present Fabrication Techniques

The present fabrication techniques for defining isolation regions onto the integrated circuit have fewer processing steps. This decreases device turn-around-time, reduces the quantity of chemicals and equipment used in the fabrication of the devices, and reduces the likelihood of particulate contamination on the wafer. Fewer masking steps also tend to increase device yields, reduce the amount of inventory in the fabrication line, and reduce the overall costs associated with the fabrication of this semiconductor integrated circuit. Accordingly, the present fabrication techniques provide superior process features, as compared to the conventional technique noted above.

An embodiment of the present fabrication technique may be briefly outlined by the following method:

(1) Provide a P-type impurity semiconductor substrate
(2) Form a pad oxide layer
(3) Form a pad polysilicon layer
(4) Form a silicon nitride layer
(5) Mask 1: Define AC (active) regions
(6) Etch AC regions
(7) Strip resist
(8) Mask 2: Define N-type impurity channel and channel stop regions
(9) Implant N-type impurities defining N-type channel and channel stop regions
(10) Strip resist
(11) Form field isolation oxide regions via oxidation
(12) Remove silicon nitride layer
(13) Remove pad polysilicon layer
(14) Remove pad oxidation layer
(15) Form sacrificial AC oxide
(16) Mask 3: Define N-type impurity well regions
(17) Implant N-type impurities defining N-type impurity well regions
(18) Strip resist
(19) Mask 4: Define P-type impurity well regions
(20) Implant P-type impurities defining P-type impurity well regions
(21) Strip resist
(22) Drive-in impurities
(23) Implant N-type impurities to adjust threshold voltage
(24) Remove sacrificial oxide
(25) Form gate oxide layer As shown above, the present fabrication technique uses fewer processing steps than the conventional technique. By way of fewer steps, the present technique is superior to the conventional fabrication technique for the reasons noted. The present fabrication technique also eliminates the steps of initial oxidation and three protection oxide layers, as required by the conventional technique. Furthermore, the present technique eliminates at least five process steps, as compared to the conventional technique. Details of this present fabrication technique are shown by the Figs. below. These Figs., however, should not limited the scope of the claims as defined herein. One of ordinary skill in the art would recognized other variations, alternatives, and modifications.

Figure 11:
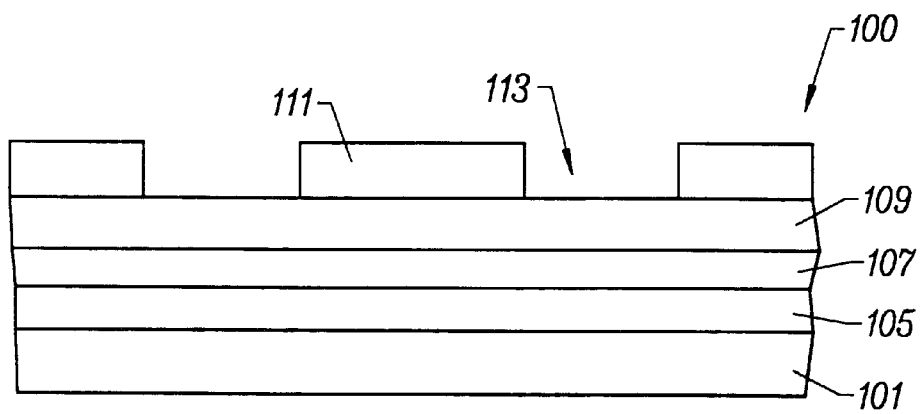
FIGS. 11–20 illustrate a technique for fabricating an isolation structure according to the present invention.

The present fabrication technique begins by providing a semiconductor substrate 101, as shown by FIG. 11. The semiconductor substrate is a P-type substrate, but can also be N-type, depending upon the application. Of course, the type of substrate depends upon the application and should not limit the scope of the claims herein.

The fabrication technique defines various layers overlying the substrate. These layers include a pad oxide layer 105, a pad polysilicon layer 107, a silicon nitride layer 109, and others, if needed. The pad oxide layer is defined onto the substrate using conventional oxidation techniques. In one embodiment, the pad oxide layer is formed using steam oxidation or the like, which provides a substantially pin-hole free, high quality, oxide film. The pad oxide layer has a thickness ranging from about 320 to about 480 Å, is preferably 400 Å and less. But the pad oxide layer can be formed by other techniques and at other thicknesses, if necessary.

Overlying the pad oxide layer 105 is the pad polysilicon layer 107. The pad polysilicon layer can be made using any suitable deposition technique such as chemical vapor deposition and the like. The pad polysilicon layer has a thickness ranging from about 200 to about 800 Å, is preferably 500 Å and less. The pad polysilicon layer can also be termed the polysilicon layer and the like.

A chemical vapor deposition technique also forms the silicon nitride layer 109 overlying the pad polysilicon layer 107. The silicon nitride layer is preferably made using plasma enhanced techniques, but others also can be used. The silicon nitride layer has a thickness ranging from about 1500 to about 2500 Å, is preferably 2000 Å and less. Of course, other materials may be used for this layer, depending upon the application.

A photoresist layer 111 is defined overlying the silicon nitride layer. The photoresist layer is generally made using steps of applying the photoresist layer via spin coating, exposing the photoresist for patterning, developing the photoresist, and others. By way of these steps, the photoresist layer now has openings 113 overlying regions, which will define isolation regions. These isolation regions will be formed through subsequent processing steps as shown below.

Figure 12:
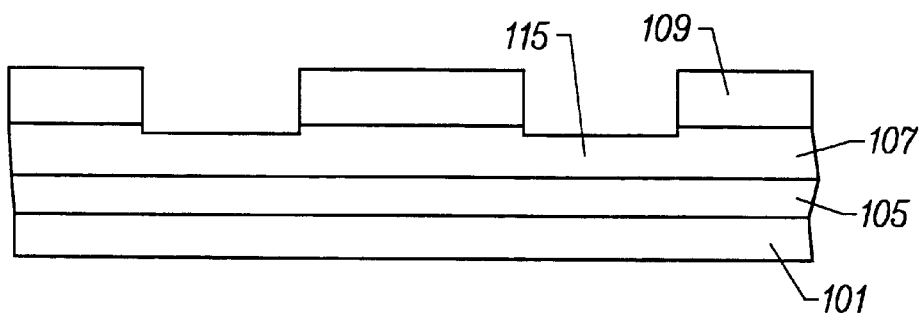

An etching step, termed as an AC (active) etching step, removes portions of the silicon nitride layer 109 and portions of the pad polysilicon layer 107 in the openings 113, as illustrated by FIG. 12. This etching step is typically a dry etching step using, for instance, plasma etching techniques. As can be seen, the etching step completely removes a thickness of the silicon nitride layer 109.

It also removes a portion of the pad polysilicon layer, leaving another portion 115 or another thickness 115 intact. The portion of pad polysilicon layer 115, which is left intact, has a thickness ranging from about 100 to about 500 Å, is preferably 300 Å and less. The thickness of polysilicon layer still intact serves as a screen for the subsequent implant step which takes place. Alternatively, the thickness of the polysilicon layer can be completely removed by way of the etching step, which leaves an exposed portion of the pad oxide layer 105. Of course, the technique used will depend upon the application.

Figure 13:
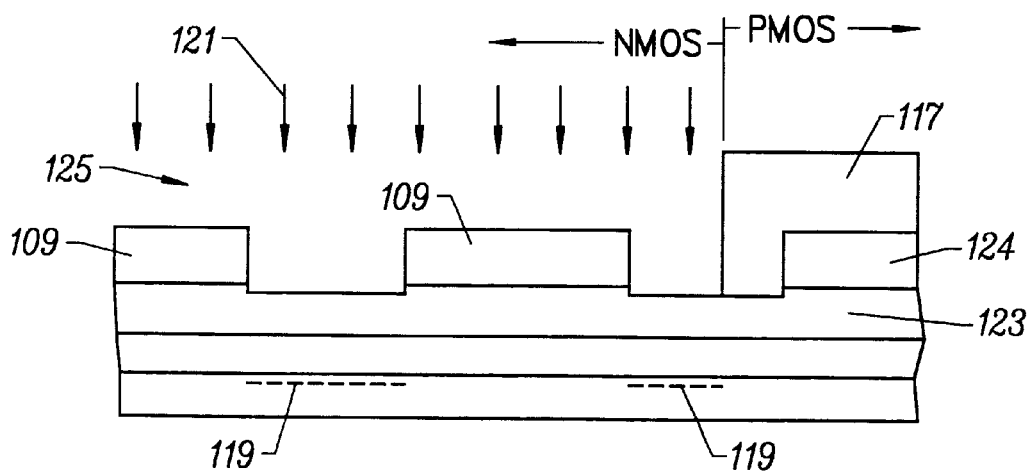

A channel stop implant is performed through openings 125 provided by a photoresist film 117, as illustrated by FIG. 13. The photoresist film 117 is applied overlying surfaces of the partially completed device structure. Steps of exposing, developing, and the like provide the photoresist film 117 or mask. The photoresist film covers a portion 123 of the exposed pad polysilicon layer 123 and covers a portion 124 of the silicon nitride layer overlying a region which will be occupied by PMOS devices. Remaining portions of the silicon nitride layer 109 mask regions which will be occupied by NMOS devices. The silicon nitride layer 109 acts as a implant mask for the channel implant process.

Implants 121 are made 119 in regions which will be defined as channel stop regions 119. The implants 121 include P-type impurities such as boron and the like. The boron is introduced using an energy ranging from about 50 to about 150 keV and at a dose which ranges from about $1 \times 10^{13}$ to about $1 \times 10^{15}$ atoms/cm$^2$. Of course, the type of impurity used and its concentration will depend upon the application. The photoresist is then stripped using conventional techniques.

Figure 14:
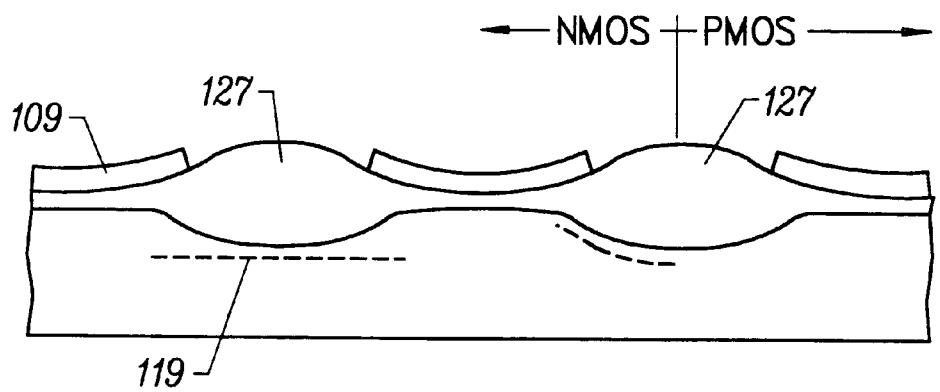
Figure 15:
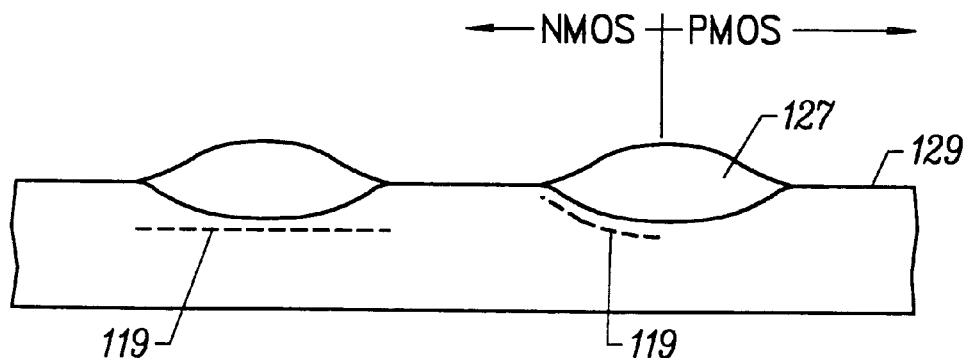

Field isolation regions 127 are defined in the substrate 101, as shown by FIG. 14. Any suitable oxidation technique can be used to oxidize the pad oxide layer 105 to define the field isolation regions 127. This oxidation technique is similar to the conventional LOCOS method, but can also be others. Preferably, the oxidation technique is steam oxidation using a furnace. As can be seen, exposed portions of the pad oxide grow or further oxidize, leaving portions of the pad oxide underlying the silicon nitride substantially unoxidized. The silicon nitride, any remaining pad polysilicon, and pad oxide layers are removed, as illustrated by FIG. 15. A layer of sacrificial oxide 129 is then defined overlying the top surface of the substrate, including field isolation oxide and active cell regions for NMOS and PMOS devices.

Figure 16:
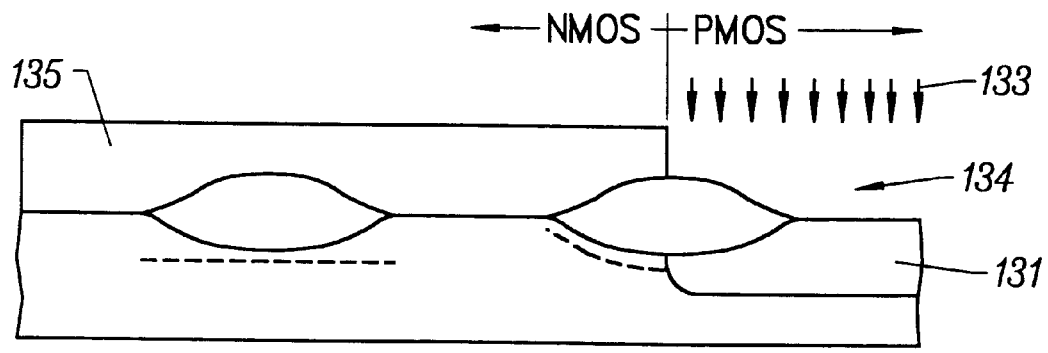
Figure 17:
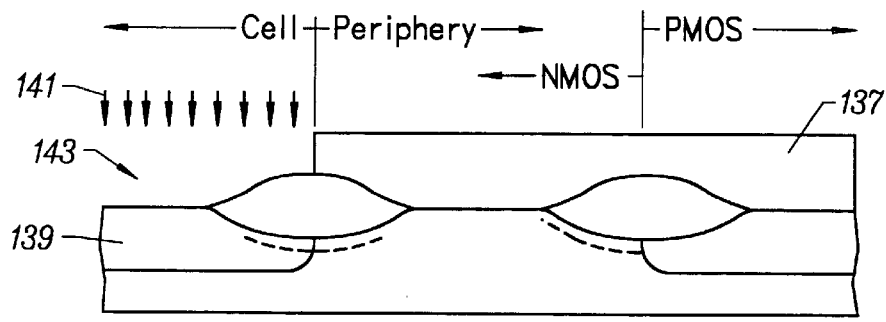

A series of masking and implantation steps are undertaken to define N-type and P-type well regions for PMOS and NMOS devices, respectively, as shown by FIGS. 16–17. A photoresist layer 135 is defined overlying the substrate and patterned to expose a region 134 corresponding to an N-type well region 131. This photoresist layer has a thickness of at least 1.2 μm to prevent implant damage to the underlying substrate.

An N-type impurity is implanted to define the N-type well region 131. This N-type impurity is often phosphorous and the like. Phosphorous is often implanted using an energy ranging from about 300 to about 360 keV at a dose about $5 \times 10^{12}$ atoms/cm$^2$. The phosphorous is a double-charged species. That is, phosphorous is $P^{2-}$ for purposes of the implant step.

Using a similar process, a P-type well region 139 is define into the substrate, as shown by FIG. 17. Photolithography defines an exposed region 143 corresponding to a P-type well region 139. An implanting step introduces a P-type impurity into the P-type well region. The P-type impurity includes boron and the like. Boron is often implanted using an energy ranging from about 100 to about 150 keV at a dose ranging from about $1 \times 10^{13}$ to about $7 \times 10^{13}$ atoms/cm$^2$. Of course, the particular dose and energy depend upon the application.

By way of defining the well regions after formation of the field isolation oxide regions, impurity concentrations below the field isolation oxide regions are generally lower than those of the conventional technique above.

Figure 18:
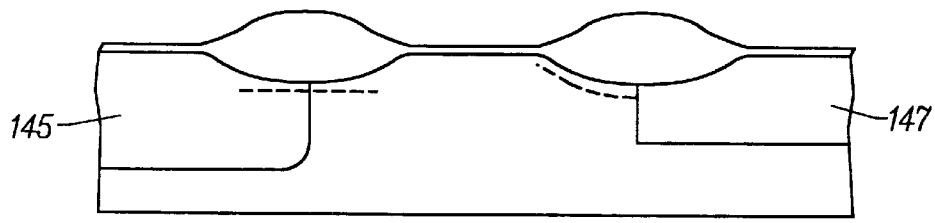

The photoresist is stripped, and an annealing step drives in the impurities, as illustrated by FIG. 18. In particular, a well drive-in process drives in N-type and P-type impurities into the substrate defining the N-type well and the P-type well, respectively. As shown, the P-type well region defines the cell region of the CMOS integrated circuit devices. The N-type well region defines the outer periphery of the CMOS integrated circuit devices.

Figure 19:
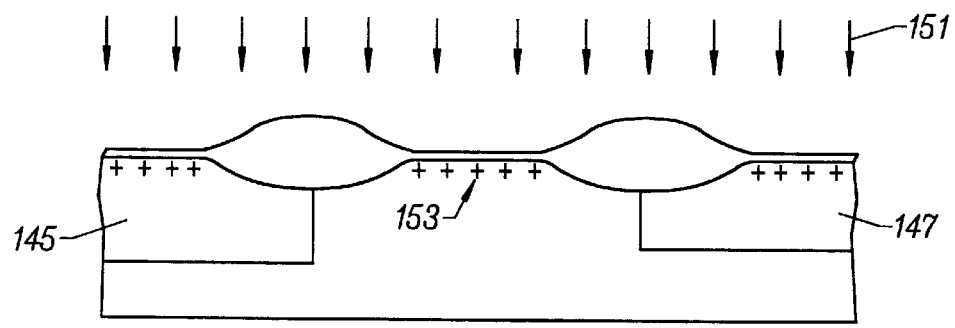
Figure 20:
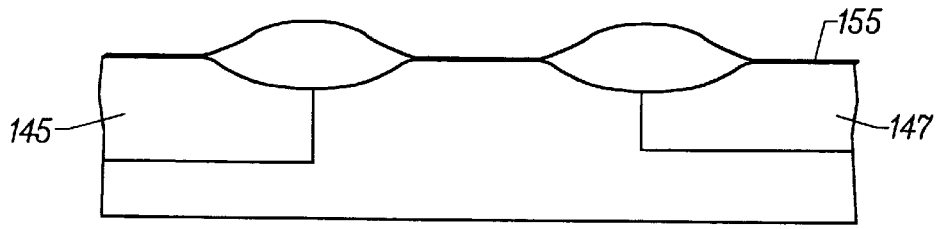

A threshold voltage implant 151 step takes place following the above well drive-in step, as illustrated by FIG. 19. The threshold voltage implant 151 step uses P-type impurities, such as boron and the like. The threshold voltage implant step blanketly introduces impurities overlying the top surface of the substrate, including P-type and N-type well regions. The concentration of N-type impurities in the substrate 153 is decreased to adjust the threshold voltage of the CMOS devices. The boron impurity is often implanted at an energy ranging from about 30 to 80 keV and a dose, which is about $1 \times 10^{12}$ atoms/cm$^2$. The blanket implant step is particularly useful to maintain the voltage threshold levels of NMOS devices. Of course, the exact dosage and energy depend upon the application.

The present fabrication technique uses less process steps than the conventional technique. The present technique eliminates the initial oxide step and at least three protection oxides used by the conventional process. It also provides for the formation of isolation regions before defining well regions via implantation techniques. Furthermore, the present process defines the active cell region before formation of the N-type and P-type well regions. Accordingly, the present technique greatly simplifies the conventional technique, thereby providing benefits such as greater cost savings and lower turn-around-times.

The well regions defined through the present process are particularly useful in the formation of sub-micron sized CMOS devices. In particular, the present process can be used in NMOS devices having a 0.5 micron channel length and less. It can also be applied in such devices for the fabrication of dynamic random access memory (DRAM) semiconductor integrated circuits. Of course, the type of circuit will depend upon the application.

While the above is a full description of the specific embodiments, various modifications, alternative constructions, and equivalents may be used. For example, while the description above is in terms of using a CMOS process, other processes such as BiCMOS may also be used.

Therefore, the above description and illustrations should not be taken as limiting the scope of the present invention, which is define by the appended claims.

What is claimed is:

1. A method of fabricating an isolation structure in an integrated circuit device, said method comprising steps of:

providing a substrate comprising an oxide layer overlying said substrate, a polysilicon layer overlying said oxide layer, and a silicon nitride layer overlying said polysilicon layer;

removing a first portion of said silicon nitride layer and a first portion of said polysilicon layer defined underlying said first portion of said silicon nitride layer to form a first exposed region of said polysilicon layer and removing a second portion of said silicon nitride layer and a second portion of said polysilicon layer defined underlying said second portion of said silicon nitride layer to form a second exposed region of said polysilicon layer;

introducing impurities into said substrate through said first exposed region of said polysilicon layer defined by said first portion of said polysilicon layer and said second exposed region of said polysilicon layer defined by said second portion of said polysilicon layers;

removing a remaining portion of said silicon nitride layer and forming a first isolation region from said first exposed region of said polysilicon layer and a second isolation region from said second exposed region of said polysilicon layer; and forming a first well region in said substrate adjacent to said first isolation region and a second well region in said substrate adjacent to said second isolation region;

wherein said first well region is defined by a double charged N-type impurity.

2. The method of claim 1 wherein said step of introducing impurities defines a first channel stop region underlying said first portion of said polysilicon layer for a first MOS device and a second channel stop region underlying said second portion of said polysilicon layer for a second MOS device.

3. The method of claim 1 wherein said first exposed region of said polysilicon layer comprises a region underlying a photomask layer and an exposed region.

4. The method of claim 1 wherein said forming of said first isolation region is provided by oxidation of said first portion of said polysilicon layer and said forming of said second isolation region is provided by oxidation of said second portion of said polysilicon layer.

5. The method of claim 1 wherein said forming of said first isolation region does not oxidize said polysilicon layer underlying said silicon nitride layer.

6. The method of claim 1 further comprising a step of providing a blanket implant step into said first well region and said second well region.

7. A method of fabricating an integrated circuit, said method comprising:

providing a semiconductor substrate comprising a first region and a second region therein;

forming a first field isolation region defined between said first region and said second region and forming a second field isolation region defined adjacent to said second region, said semiconductor substrate having a first channel stop region defined underlying said first field isolation region and a second channel stop region being defined underlying said second field isolation region;

defining a first well region by a first impurity type in said first region and defining a second well region by a second impurity type in said second region;

wherein said first impurity type comprises a double charged N-type impurity.

8. The method of claim 7 wherein said second impurity type is a P-type impurity.

9. The method of claim 7 further comprising a step of blanket implanting a third impurity type into said first well region and said second well region.

10. The method of claim 7 wherein said double charged N-type impuritiy comprises a phosphorous species.

11. The method of claim 7 wherein said double charged N-type impurity includes a dose from about $5 \times 10^{12}$ atoms/cm$^2$.

12. The method of claim 7 wherein said double charged N-type impurity comprises a $P^{2-}$ species.

13. The method of claim 7 wherein said double charged N-type impurity is provided at an energy ranging from about 300 to about 360 keV.

14. A method of fabricating an integrated circuit, said method comprising:

providing a semiconductor substrate comprising a first region and a second region therein;

forming a first field isolation region defined between said first region and said second region and forming a second field isolation region defined adjacent to said second region, said semiconductor substrate having a first channel stop region defined underlying said first field isolation region and a second channel stop region being defined underlying said second field isolation region;

defining a first well region by a first impurity type in said first region and defining a second well region by a second impurity type in said second region;

wherein said first impurity type comprises a double charged N-type impurity comprising a $P^{2-}$ species.

15. The method of claim 14 further comprising a step of blanket implanting a third impurity type into said first well region and said second well region.

16. The method of claim 14 wherein said double charged N-type impurity has a dose from about $5 \times 10^{12}$ atoms/cm$^2$.

17. The method of claim 14 wherein said double charged N-type impurity is provided at an energy ranging from about 300 to about 360 keV.

* * * * *